(12) United States Patent
Mizumura et al.

(10) Patent No.: US 10,896,817 B2
(45) Date of Patent: Jan. 19, 2021

(54) LASER IRRADIATION APPARATUS, THIN FILM TRANSISTOR, AND METHOD OF MANUFACTURING THIN FILM TRANSISTOR

(71) Applicants: V Technology Co., Ltd., Yokohama (JP); Sakai Display Products Corporation, Sakai (JP)

(72) Inventors: Michinobu Mizumura, Yokohama (JP); Nobutake Nodera, Sakai (JP); Yoshiaki Matsushima, Sakai (JP); Masakazu Tanaka, Sakai (JP); Takao Matsumoto, Sakai (JP)

(73) Assignees: V Technology Co. Ltd., Yokohama (JP); Sakai Display Products Corporation, Sakai (JP)

( * ) Notice: Subject to any disclaimer, the term of this patent is extended or adjusted under 35 U.S.C. 154(b) by 0 days.

(21) Appl. No.: 16/410,348

(22) Filed: May 13, 2019

(65) Prior Publication Data

US 2019/0267235 A1      Aug. 29, 2019

Related U.S. Application Data

(63) Continuation of application No. PCT/JP2016/083991, filed on Nov. 16, 2016.

(51) Int. Cl.
*H01L 21/00* (2006.01)
*H01L 21/02* (2006.01)
(Continued)

(52) U.S. Cl.
CPC .. *H01L 21/02356* (2013.01); *H01L 21/02422* (2013.01); *H01L 21/02532* (2013.01);
(Continued)

(58) Field of Classification Search
CPC ......... H01L 21/02356; H01L 21/02691; H01L 21/02422; H01L 21/02678;
(Continued)

(56) References Cited

U.S. PATENT DOCUMENTS 7,300,858 B2 * 11/2007 Im ..................... B23K 26/067
                                                        438/487
8,507,156 B2 *  8/2013 Park .................... C30B 1/023
                                                        430/5
(Continued)

FOREIGN PATENT DOCUMENTS

JP      9-260681 A    10/1997
JP     11-243057 A     9/1999
(Continued)

OTHER PUBLICATIONS

International Search Report dated Dec. 13, 2016, of counterpart International Application No. PCT/JP2016/083991 along with an English translation.

(Continued)

*Primary Examiner* — Vu A Vu
(74) *Attorney, Agent, or Firm* — DLA Piper LLP (US)

(57) ABSTRACT

A laser irradiation apparatus includes a light source that generates a laser beam, a projection lens that radiates the laser beam onto a predetermined region of an amorphous silicon thin film deposited on each of a plurality of thin film transistors on a glass substrate, and a projection mask pattern provided on the projection lens and has a plurality of openings so that the laser beam is radiated onto each of the plurality of thin film transistors, wherein the projection lens radiates the laser beam onto the plurality of thin film transistors on the glass substrate, which moves in a predetermined direction, through the projection mask pattern, and the projection mask pattern is provided such that the open- (Continued)

ings are not continuous in one column orthogonal to the moving direction.

18 Claims, 7 Drawing Sheets

(51) Int. Cl.
*H01L 21/20* (2006.01)
*H01L 21/268* (2006.01)
*H01L 21/67* (2006.01)
*H01L 29/786* (2006.01)

(52) U.S. Cl.
CPC .. *H01L 21/02595* (2013.01); *H01L 21/02678* (2013.01); *H01L 21/02691* (2013.01); *H01L 21/2011* (2013.01); *H01L 21/2686* (2013.01); *H01L 21/67115* (2013.01); *H01L 29/78672* (2013.01)

(58) Field of Classification Search
CPC ......... H01L 21/02532; H01L 29/78672; H01L 21/67115; H01L 21/2686; H01L 21/2011; H01L 21/02595; H01L 29/66757; H01L 27/1285; H01L 29/78675; H01L 21/268

USPC ........................................................ 438/487
See application file for complete search history.

(56) References Cited

U.S. PATENT DOCUMENTS 8,663,387 B2 * 3/2014 Im .................... H01L 21/02532
117/4
10,211,343 B2 2/2019 Mizumura et al.
2011/0121306 A1 5/2011 Im et al.
2012/0220140 A1 8/2012 Kajiyama et al.

FOREIGN PATENT DOCUMENTS

JP 2011-100838 A 5/2011
JP 2013-512566 A 4/2013
JP 2016-100537 A 5/2016

OTHER PUBLICATIONS

Notice of Reasons for Refusal dated Apr. 21, 2020, of counterpart Japanese Application No. 2018-550919, along with an English translation.

* cited by examiner

LASER IRRADIATION APPARATUS, THIN FILM TRANSISTOR, AND METHOD OF MANUFACTURING THIN FILM TRANSISTOR

CROSS REFERENCE TO RELATED APPLICATION

This U.S. non-provisional application is a continuation application of, and claims the benefit of priority under 35 U.S.C. § 365(c) from, PCT International Application PCT/JP2016/083991, filed on Nov. 16, 2016, and which designated the U.S., the entire contents of which are incorporated herein by reference.

TECHNICAL FIELD

This disclosure relates to formation of a thin film transistor and, more particularly, to a laser irradiation apparatus that forms a polysilicon thin film by irradiating an amorphous silicon thin film on a thin film transistor with a laser beam, a thin film transistor, and a method of manufacturing the thin film transistor.

BACKGROUND

As a thin film transistor having a reverse staggered structure, there is one using an amorphous silicon thin film in a channel region. However, since the amorphous silicon thin film has low electron mobility, when the amorphous silicon thin film is used for the channel region, there is a problem that the mobility of charges in the thin film transistor is reduced.

Therefore, there is a technology in which a predetermined region of the amorphous silicon thin film is polycrystallized by instantaneous heating using a laser beam, a polysilicon thin film having high electron mobility is formed, and the polysilicon thin film is used for the channel region.

For example, Japanese Unexamined Patent Application Publication No. 2016-100537 discloses an amorphous silicon thin film formed in the channel region, and then the polysilicon thin film is crystallized by melting and solidifying the amorphous silicon thin film in a short time through laser annealing in which the amorphous silicon thin film is irradiated with a laser beam such as an excimer laser. Japanese Unexamined Patent Application Publication No. 2016-100537 describes that a channel region between a source and a drain of a thin film transistor can be made as a polysilicon thin film with high electron mobility by performing the above-described process, and it is possible to speed up an operation of the transistor.

In the thin film transistor described in Japanese Unexamined Patent Application Publication No. 2016-100537, the channel region between the source and the drain is formed of a single (one) polysilicon thin film. Therefore, characteristics of the thin film transistor depend on the single (one) polysilicon thin film.

Since energy density of the laser beam such as an excimer laser varies with every irradiation (shot), a variation occurs also in the electron mobility of the polysilicon thin film formed using the laser beam. Therefore, the characteristics of the thin film transistor formed using the polysilicon thin film also depend on a variation in the energy density of the laser beam.

As a result, a variation may occur in the characteristics of a plurality of thin film transistors included in a glass substrate.

It could therefore be helpful to provide a laser irradiation apparatus, a thin film transistor, and a method of manufacturing the thin film transistor capable of minimizing a variation in characteristics of a plurality of thin film transistors included in a glass substrate.

SUMMARY

We thus provide:

A laser irradiation apparatus including a light source that generates a laser beam, a projection lens that radiates the laser beam onto a predetermined region of an amorphous silicon thin film deposited on each of a plurality of thin film transistors on a glass substrate, and a projection mask pattern provided on the projection lens and has a plurality of openings so that the laser beam is radiated onto each of the plurality of thin film transistors, wherein the projection lens radiates the laser beam onto the plurality of thin film transistors on the glass substrate, which moves in a predetermined direction, through the projection mask pattern, and the projection mask pattern is provided such that the openings are not continuous in one column orthogonal to the moving direction.

The projection lens may be a plurality of micro-lenses included in a micro-lens array capable of separating the laser beam, and the openings may be provided in the projection mask pattern so that, among the micro-lenses in one column orthogonal to the moving direction, the micro-lenses radiating the laser beam through the openings are not adjacent to each other.

The laser beam emitted from the light source may be radiated onto the plurality of thin film transistors through the micro-lenses corresponding to the one column in the orthogonal direction in one irradiation, and the openings may be provided in the projection mask pattern so that the laser beam is radiated through the micro-lenses not adjacent to each other among the micro-lenses corresponding to the one column.

The projection lens may irradiate each of the plurality of thin film transistors with a predetermined number of laser beams and, in the projection mask pattern, a predetermined number of openings may be provided in the moving direction.

The projection lens may radiate the laser beam onto a predetermined region of the amorphous silicon thin film deposited between a source electrode and a drain electrode included in the thin film transistor, and a polysilicon thin film may be formed.

A method of manufacturing a thin film transistor includes a first step of generating a laser beam, a second step of radiating the laser beam on a predetermined region of an amorphous silicon thin film deposited on each of a plurality of thin film transistors on a glass substrate using a projection lens having a projection mask pattern including a plurality of openings, and a third step of moving the glass substrate in a predetermined direction whenever the laser beam is radiated, wherein, in the second step, the laser beam is radiated through the projection mask pattern disposed so that the openings are not continuous in one column orthogonal to the moving direction.

The projection lens may be a plurality of micro-lenses included in a micro-lens array capable of separating the laser beam and, in the second step, the laser beam may be radiated through the projection mask pattern in which the openings are provided so that, among the micro-lenses in the one column orthogonal to the moving direction, the micro-lenses radiating the laser beam through the openings are not adjacent to each other.

The openings may be provided in the projection mask pattern so that the laser beam is radiated through the micro-lenses not adjacent to each other among the micro-lenses corresponding to the one column and, in the second step, the laser beam may be radiated onto the plurality of thin film transistors through the micro-lenses corresponding to the one column in the orthogonal direction in one irradiation.

In the second step, a predetermined number of laser beams may be radiated onto each of the plurality of thin film transistors through the projection mask pattern in which a predetermined number of openings are provided in the moving direction.

In the second step, the laser beam may be radiated onto a predetermined region of the amorphous silicon thin film deposited between a source electrode and a drain electrode included in the thin film transistor, and a polysilicon thin film may be formed.

It is possible to provide a laser irradiation apparatus, a thin film transistor, and a method of manufacturing the thin film transistor capable of minimizing a variation in characteristics of a plurality of thin film transistors included in a glass substrate.

REFERENCE SIGNS LIST

10 Laser irradiation apparatus
11 Laser beam source
12 Coupling optical system
13 Micro-lens array
14 Laser beam
15 Projection mask pattern
16 Transmission region
17 Micro-lens
18 Projection lens
20 Thin film transistor
21 Amorphous silicon thin film
22 Polysilicon thin film
23 Source
24 Drain
30 Glass substrate

DETAILED DESCRIPTION

Hereinafter, examples will be specifically described with reference to the attached drawings.

FIRST EXAMPLE

Figure 1:
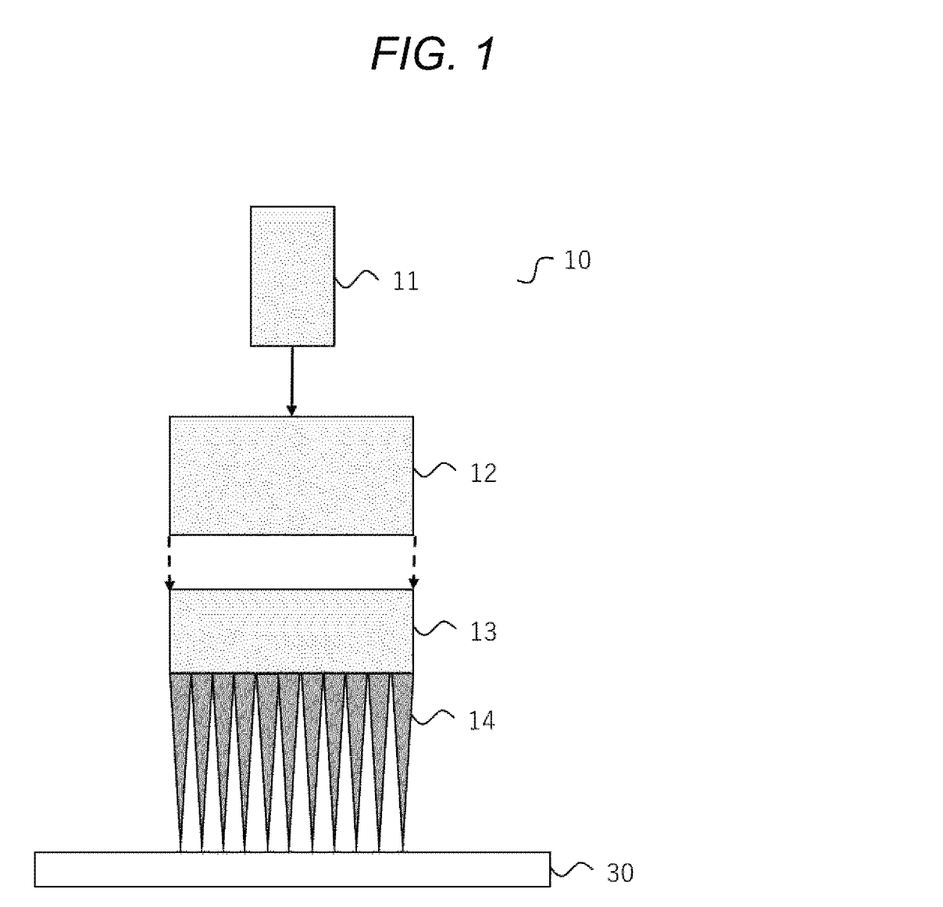
FIG. 1 is a view showing a configuration example of a laser irradiation apparatus 10.

FIG. 1 is a view showing a configuration example of a laser irradiation apparatus 10 according to a first example.

In the first example, the laser irradiation apparatus 10 is an apparatus in which, for example, only a region in which a channel region is to be formed is irradiated and annealed with a laser beam and the region in which the channel region is to be formed is polycrystallized in a manufacturing process of a semiconductor device such as a thin film transistor (TFT) 20.

The laser irradiation apparatus 10 is used, for example, when a thin film transistor of a pixel such as a peripheral circuit of a liquid crystal display device is formed. When such a thin film transistor is formed, first, a gate electrode formed of a metal film such as Al is patterned and formed on the glass substrate 30 by sputtering. Then, a gate insulating film formed of a SiN film is formed on the entire surface of the glass substrate 30 by a low temperature plasma CVD method. Thereafter, an amorphous silicon thin film 21 is formed on the gate insulating film, for example, by a plasma CVD method. Additionally, a predetermined region on the gate electrode of the amorphous silicon thin film 21 is irradiated and annealed with a laser beam 14 by the laser irradiation apparatus 10 exemplified in FIG. 1, and thus the predetermined region is polycrystallized to be polysiliconized.

As shown in FIG. 1, in the laser irradiation apparatus 10, a beam system of the laser beam emitted from a laser beam source 11 is expanded by a coupling optical system 12, and a luminance distribution thereof is made uniform. The laser beam source 11 is an excimer laser that emits, for example, a laser beam having a wavelength of 308 nm or 248 nm at a predetermined repetition cycle.

Then, the laser beam is separated into a plurality of laser beams 14 by a plurality of openings (transmission regions) of a projection mask pattern 15 (not shown) provided on the micro-lens array 13 and then radiated onto a predetermined region of the amorphous silicon thin film 21. The projection mask pattern 15 is provided on the micro-lens array 13, and the predetermined region is irradiated with the laser beam 14 by the projection mask pattern 15. Then, the predetermined region of the amorphous silicon thin film 21 is instantaneously heated and melted, and a part of the amorphous silicon thin film 21 becomes a polysilicon thin film 22.

Since the polysilicon thin film 22 has higher electron mobility than the amorphous silicon thin film 21, the polysilicon thin film 22 is used as a channel region to electrically connect the source 23 with the drain 24 in the thin film transistor 20. In FIG. 1, although the example using the micro-lens array 13 is shown, it is not necessary to necessarily use the micro-lens array 13, and the laser beam 14 may be radiated using one projection lens. In the first example, the polysilicon thin film 22 may be formed using the micro-lens array 13 and will be described as an example.

Figure 2:
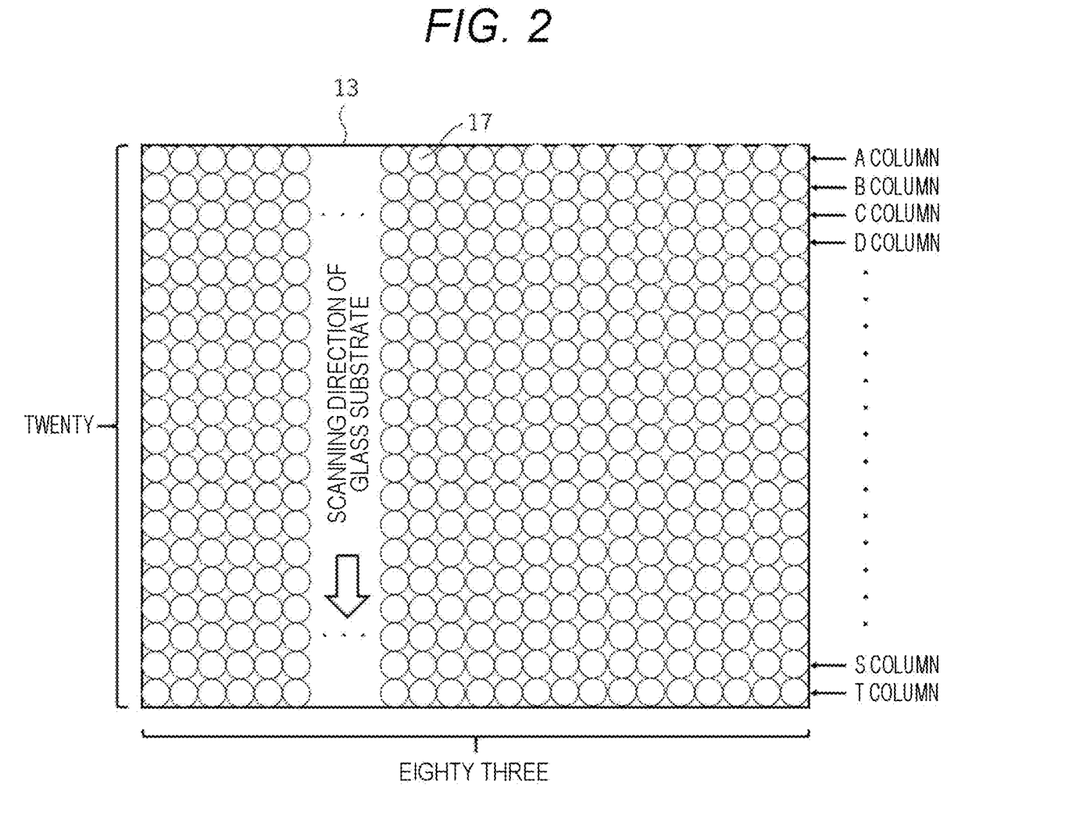
FIG. 2 is a view showing a configuration example of a micro-lens array 13.

FIG. 2 is a view showing a configuration example of the micro-lens array 13 used in annealing. As shown in FIG. 2, in the micro-lens array 13, twenty micro-lenses 17 are disposed in one column (or one row) in a scanning direction. The laser irradiation apparatus 10 in FIG. 1 radiates the laser beam 14 using at least some of the twenty micro-lenses 17 included in one column (or one row) of the micro-lens array 13 for one thin film transistor 20. The number of micro-lenses 17 in one column (or one row) included in the micro-lens array 13 is not limited to 20 and may be any number.

As shown in FIG. 2, in the micro-lens array 13, twenty micro-lenses 17 are included in one column (or one row), but for example, 83 micro-lenses 17 are included in one row (or one column). The 83 micro-lenses 17 are just an example and any number may be used.

Figure 3:
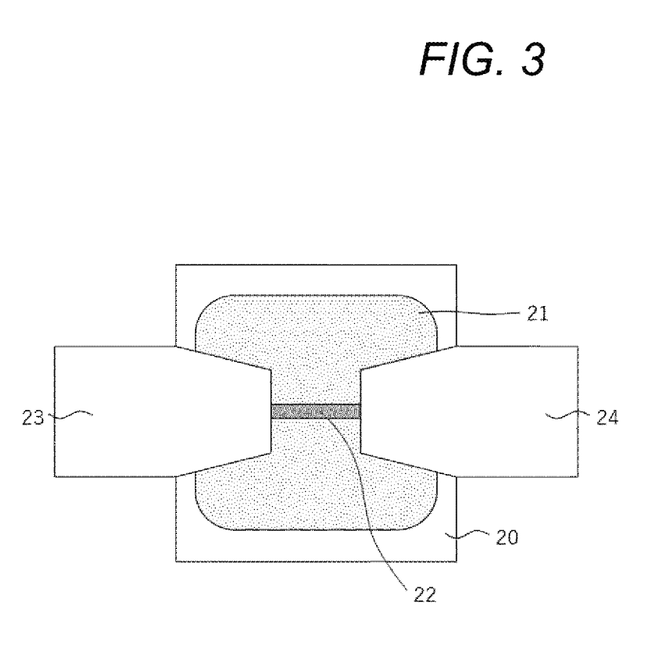
FIG. 3 is a schematic view showing an example of a thin film transistor 20 in which a predetermined region is annealed.

FIG. 3 is a schematic view showing an example of the thin film transistor 20 in which a predetermined region is annealed. The thin film transistor 20 is formed by first forming the polysilicon thin film 22 and then forming the source 23 and the drain 24 at both ends of the formed polysilicon thin film 22.

As shown in FIG. 3, in the thin film transistor, the polysilicon thin film 22 is formed between the source 23 and the drain 24. The laser irradiation apparatus 10 radiates the laser beam 14 using, for example, the twenty micro-lenses 17 included in one column (or one row) of the micro-lens array 13 shown in FIG. 3 for one thin film transistor 20. That is, the laser irradiation apparatus 10 radiates 20 shots of laser beams 14 to the polysilicon thin film 22. As a result, in the thin film transistor 20, a predetermined region of the amorphous silicon thin film 21 is instantaneously heated and melted and becomes the polysilicon thin film 22.

Figure 4:
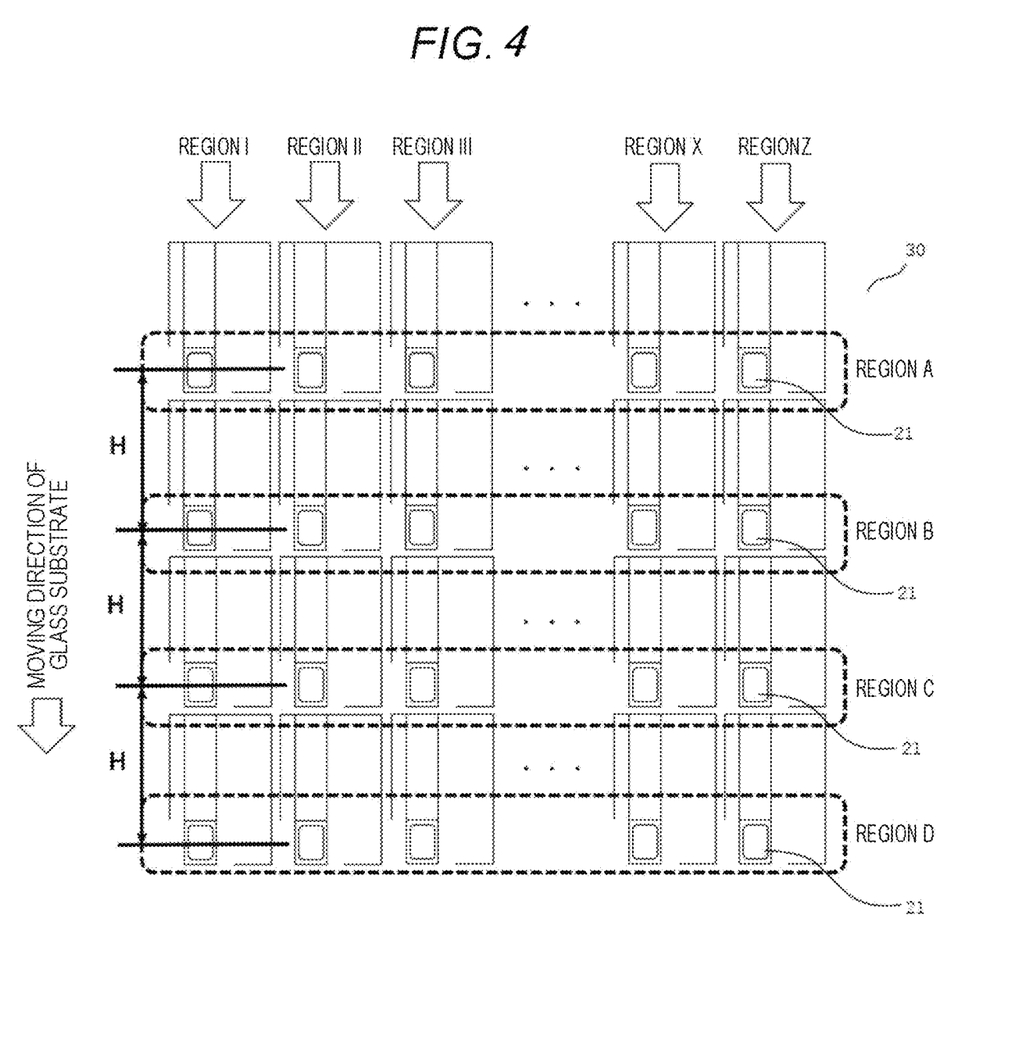
FIG. 4 is a schematic view showing an example of a glass substrate 30 that the laser irradiation apparatus 10 irradiates with a laser beam 14.

FIG. 4 is a schematic view showing an example of the glass substrate 30 onto which the laser irradiation apparatus 10 radiates the laser beam 14. As shown in FIG. 4, the glass substrate 30 includes a plurality of pixels 31, and each of the pixels 31 includes the thin film transistor 20. The thin film transistor 20 performs transmission control of lights in the plurality of pixels 31 by electrically turning them ON/OFF. As shown in FIG. 4, the amorphous silicon thin film 21 is provided on the glass substrate 30 at a predetermined interval "H." A portion of the amorphous silicon thin film 21 is a portion that will become the thin film transistor 20.

The laser irradiation apparatus 10 irradiates the amorphous silicon thin film 21 with the laser beam 14. The laser irradiation apparatus 10 radiates the laser beam 14 at a predetermined cycle and moves the glass substrate 30 during a time when the laser beam 14 is not radiated so that a next portion of the amorphous silicon thin film 21 is irradiated with the laser beam 14. As shown in FIG. 3, on the glass substrate 30, the amorphous silicon thin film 21 is disposed at the predetermined interval "H" in a moving direction. Then, the laser irradiation apparatus 10 irradiates the portion of the amorphous silicon thin film 21 disposed on the glass substrate 30 with the laser beam 14 at a predetermined cycle.

Then, the laser irradiation apparatus 10 irradiates a plurality of amorphous silicon thin films 21 on the glass substrate with the same laser beam 14 using the micro-lens array 13. The laser irradiation apparatus 10 irradiates, for example, the plurality of amorphous silicon thin films 21 included in a region A shown in FIG. 3 with the same laser beam 14. Further, the laser irradiation apparatus 10 also irradiates the plurality of amorphous silicon thin films 21 included in a region B shown in FIG. 4 with the same laser beam 14.

It is possible that the laser irradiation apparatus 10 radiates the laser beam 14 to perform the annealing using each of the twenty micro-lenses 17 included in one column (or one row) of the micro-lens array 13 shown in FIG. 2.

In this example, the plurality of amorphous silicon thin films 21 in the region A of FIG. 4 are first irradiated with the laser beam 14 using a first micro-lens 17a included in the micro-lens array 13 shown in FIG. 2. Thereafter, the glass substrate 30 is moved by the predetermined distance "H." While the glass substrate 30 is moving, the laser irradiation apparatus 10 stops the irradiation of the laser beam 14. Additionally, after the glass substrate 30 has moved by "H," the plurality of amorphous silicon thin films 21 in the region A are irradiated with the laser beam 14 using a second micro-lens 17b included in the micro-lens array 13 shown in FIG. 2. After the glass substrate 30 has moved by "H," the laser irradiation apparatus 10 may irradiate the temporarily stopped glass substrate 30 with the laser beam 14 or may irradiate the moving glass substrate 30 with the laser beam 14.

An irradiation head (that is, the laser beam source 11, the coupling optical system 12, the micro-lens array 13, and the projection mask 150) of the laser irradiation apparatus 10 may move relative to the glass substrate 30.

The laser irradiation apparatus 10 performs this repeatedly and finally irradiates the plurality of amorphous silicon thin films 21 in the region A with the laser beam 14 using the micro-lens 17t (that is, the last micro-lens 17) of the micro-lens array 13 shown in FIG. 2. As a result, the plurality of amorphous silicon thin films 21 in the region A are irradiated with the laser beam 14 using each of the twenty micro-lenses 17 included in one column (or one row) of the micro-lens array 13 shown in FIG. 2.

Similarly, the laser irradiation apparatus 10 irradiates the plurality of amorphous silicon thin films 21 in the region B of FIG. 4 with the laser beam 14 using each of the twenty micro-lenses 17 included in one column (or one row) of the micro-lens array 13 shown in FIG. 2. However, since the region B is different in position from the region A by "H" in the moving direction of the glass substrate, a timing of the irradiation with the laser beam 14 is delayed by one irradiation. That is, when the plurality of amorphous silicon thin films 21 in the region A are irradiated with the laser beam 14 using the second micro-lens 17b, the plurality of amorphous silicon thin films 21 in the region B are irradiated with the laser beam 14 using the first micro-lens 17a. Additionally, when the plurality of amorphous silicon thin films 21 in the region A are irradiated with the laser beam 14 using the twentieth micro-lens 17t (that is, the last micro-lens 17), the plurality of amorphous silicon thin films 21 in the region B are irradiated with laser beam using the immediately preceding nineteenth micro-lens 17s. Then, the plurality of amorphous silicon thin films 21 in the region B are irradiated with the laser beam using the twentieth micro-lens 17t (that is, the last micro-lens 17) at a next irradiation timing of the laser beam.

That is, the plurality of amorphous silicon thin films 21 in the region A and the plurality of amorphous silicon thin films 21 in the region B shown in FIG. 4 are lastly irradiated with the laser beams 14 different from each other.

In the excimer laser, stability between pulses is about 0.5%. That is, the laser irradiation apparatus 10 causes about 0.5% variation in the energy density of the laser beam 14 for each shot. Therefore, a variation may also occur in the electron mobility of the polysilicon thin film 22 formed by the laser irradiation apparatus 10. Additionally, the electron mobility of the polysilicon thin film 22 formed by the irradiation with the laser beam 14 depends on energy density of the laser beam 14 lastly radiated onto the polysilicon thin film 22, that is, energy density of the last shot.

Accordingly, since the plurality of amorphous silicon thin films 21 in the region A and the plurality of amorphous silicon thin films 21 in the region B are lastly irradiated with the laser beams different from each other, the electron mobility will differ between the formed polysilicon thin films 22.

On the other hand, since the plurality of amorphous silicon thin films 21 included in the region A are lastly irradiated with the same laser beam 14, the electron mobility of the formed polysilicon thin films 22 is the same in the region A. The same applies to the plurality of amorphous silicon thin films 21 included in the region B. In the region B, the electron mobility of the formed polysilicon thin films 22 is the same. That is, on the glass substrate, although the electron mobility differs between adjacent regions, the electron mobility of the plurality of amorphous silicon thin films 21 in the same region is the same.

This causes display unevenness to occur on a liquid crystal screen. As exemplified in FIG. 4, since a boundary between the region A and the region B is "linear," the thin film transistors 20 having different characteristics will meet at the "stripe" boundary, and a difference in display due to the difference in the characteristics (for example, the difference in light and shade of a color) appears "linear." As a result, the display unevenness on the liquid crystal screen becomes "striped" and is emphasized to an extent that cannot be ignored.

Therefore, in the first example, each of the plurality of amorphous silicon thin films 21 included in the same region (for example, in the region A) shown in FIG. 3 is adapted not to be irradiated with the same laser beam 14. That is, with respect to a plurality of amorphous silicon thin films 21 included in the same region (for example, in the region A), at least adjacent amorphous silicon thin films 21 are irradiated with the laser beams 14 different from each other. As a result, in the same region (for example, in the region A), the laser beams 14 lastly radiated on the adjacent amorphous silicon thin films 21 are also different from each other. As a result, in the same region (for example, in the region A), the electron mobility will differ between the adjacent polysilicon thin films 22. Therefore, in the same region (for example, in the region A), the characteristics of the adjacent thin film transistors 20 are also different from each other. Thus, in the entire glass substrate 30, the characteristics of the thin film transistors 20 adjacent to each other are different from each other, and the difference in display (for example, the difference in light and shade of a color) due to the difference in the characteristics does not appear "linear." Therefore, in the liquid crystal screen, the display unevenness does not become "striped," and the display unevenness can be prevented from being emphasized.

Figure 5A:
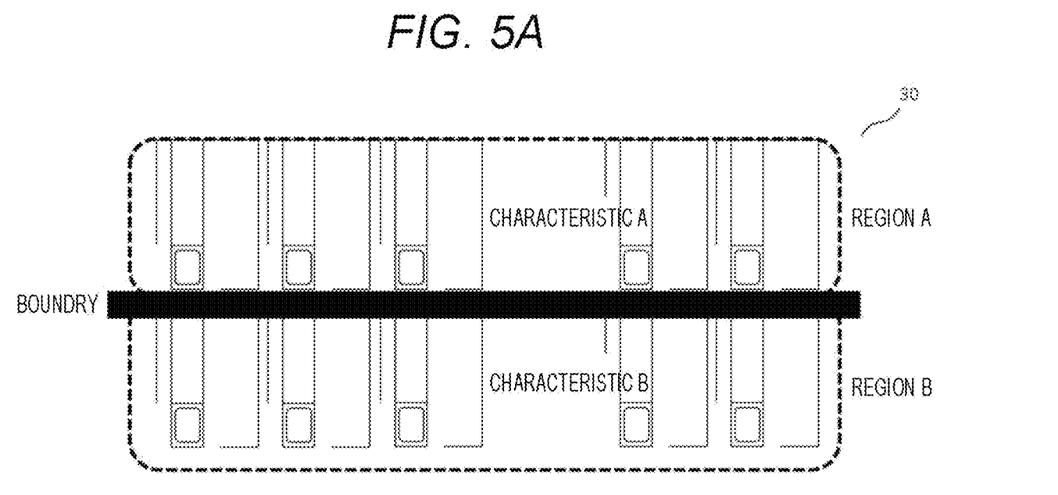
FIGS. 5(A) and 5(B) each are a schematic view showing another example of the glass substrate 30 that the laser irradiation apparatus 10 irradiates with the laser beam 14.
Figure 5B:
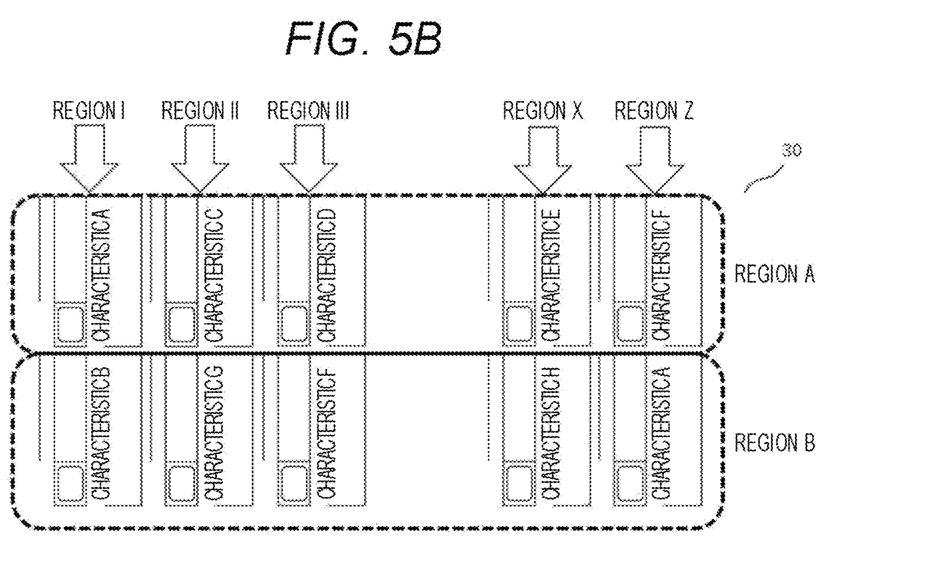

FIGS. 5(A) and 5(B) are views explaining whether the display unevenness occurs due to the thin film transistors 20 adjacent to each other on the glass substrate 30. In FIG. 5(A), the characteristics of the plurality of thin film transistors 20 in the region A are the same characteristics A, and the characteristics of the plurality of thin film transistors 20 in the region B are the same characteristics B. As a result, the thin film transistor 20 having the characteristic A and the thin film transistor 20 having the characteristic B meet at the "stripe" boundary between the region A and the region B, and a difference in the display due to a difference in the characteristics becomes "linear" and appears in a line. Therefore, the display unevenness is emphasized as "stripes" on the liquid crystal screen.

On the other hand, in FIG. 5(B), since the adjacent thin film transistors 20 in the same region (the region A/the region B) have different characteristics from each other, the difference in display due to the difference in characteristics is dispersed, and the difference in display due to the difference in characteristics does not become "linear." Therefore, it is possible to reduce the display unevenness in the liquid crystal screen.

To realize the content described above, in the first example, the laser irradiation apparatus 10 radiates the laser beam 14 on one amorphous silicon thin film 21 using some of the twenty micro-lenses 17 included in one column (or row) of the micro-lens array 13 shown in FIG. 2. For example, the laser irradiation apparatus 10 radiates the laser beam 14 on one amorphous silicon thin film 21 using five of the twenty micro-lenses 17 included in one column (or row) of the micro-lens array 13.

Further, in the first example, the laser irradiation apparatus 10 randomly disposes some of the micro-lenses 17 to be used in the scanning direction. For example, among the twenty micro-lenses 17, the laser irradiation apparatus 10 randomly disposes five micro-lenses 17, which irradiate one amorphous silicon thin film 21, in the scanning direction.

As a result, in the same region (for example, in the region A) shown in FIG. 3, the adjacent amorphous silicon thin films 21 are not irradiated with the same laser beam 14. Thus, with respect to the plurality of amorphous silicon thin films 21 included in the same region (for example, in the region A), at least adjacent amorphous silicon thin films 21 are irradiated with the laser beams 14 different from each other. As a result, in the same region (for example, in the region A), the laser beams 14 lastly radiated onto the adjacent amorphous silicon thin films 21 are also different. As a result, in the same region (for example, in the region A), the electron mobility will differ between the adjacent polysilicon thin films 22.

In the first example, openings (passing regions) of the projection mask pattern 15 provided on the micro-lens array 13 are configured to transmit the laser beam 14 from five of the twenty micro-lenses 17 in the scanning direction, and the openings (the passing regions) are configured not to be continuous in one column (or one row) orthogonal to the scanning direction.

Figure 6:
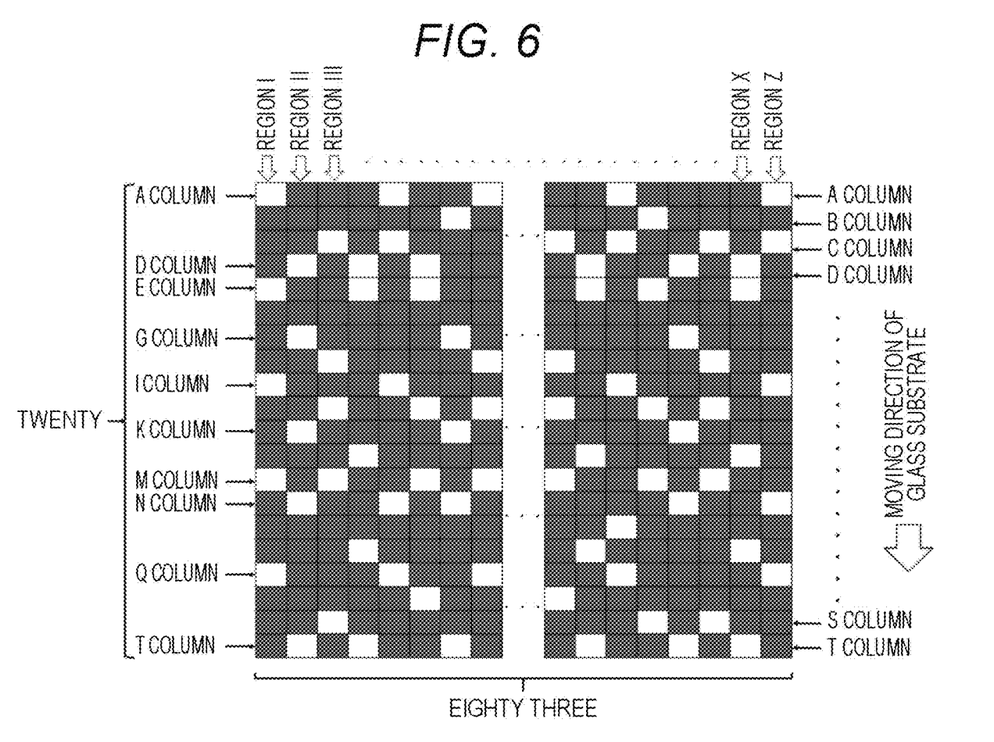
FIG. 6 is a schematic view showing a configuration example of a projection mask pattern 15 provided in the micro-lens array 13.

FIG. 6 is a view showing a configuration example of the openings (the passing regions) of the projection mask pattern 15 in the first example.

As shown in FIG. 6, the projection mask pattern 15 has the openings (the transmission regions) so that the laser beam 14 can be transmitted from five of the twenty micro-lenses 17 in the scanning direction. Further, as shown in FIG. 6, the projection mask pattern 15 has the openings (the passing regions) that are not continuous in one column (or one row) orthogonal to the scanning direction. The laser beam 14 passes through the transmission region 16 and is projected onto the amorphous silicon thin film 21 on the thin film transistor 20. A width of the transmission region 16 in each projection mask pattern 15 is 4 μm, for example.

FIG. 6 is an example, and the openings (the passing regions) of the projection mask pattern 15 may be disposed so that the laser beam 14 from five of the twenty micro-lenses 17 in the scanning direction is transmitted and may also be disposed not to be continuous in one column (or one row) orthogonal to the scan direction.

Further, in the projection mask pattern 15, the number of openings (the passing regions) in the scanning direction is not limited to five and may be four or six, for example.

Further, the projection mask pattern 15 is not necessarily disposed not to be continuous in one column (or one row) orthogonal to the scanning direction and may be continuous if the number is small such as two.

The opening provided in the projection mask pattern 15 shown in FIG. 6 has, for example, a rectangular shape with a long side of 20 µm and a short side of 10 µm. A size of the opening in the projection mask pattern 15 is an example, and any size may be used as long as it corresponds to a size of the micro-lens 17.

In the example of FIG. 6, the transmission region 16 of the projection mask pattern 15 is provided to be orthogonal to the moving direction (the scanning direction) of the glass substrate 30. The transmission region 16 of the projection mask pattern 15 does not have to be orthogonal to the moving direction (the scanning direction) of the glass substrate 30 and may be provided in parallel (substantially parallel) with the moving direction (the scanning direction).

The laser irradiation apparatus 10 radiates the laser beam 14 onto the glass substrate 30 exemplified in FIG. 2 using the projection mask pattern 15 shown in FIG. 6. As a result, in the glass substrate 30 exemplified in FIG. 4, for example, the thin film transistor 20 in a region I is irradiated with the laser beam 14 using five micro-lenses 17 of an A column, an E column, an I column, an M column, and a Q column among the micro-lenses 17 exemplified in FIG. 2. On the other hand, the thin film transistor 20 in a next region II is irradiated with the laser beam 14 using five micro-lenses 17 of a D column, a G column, a K column, an N column, and a T column among micro-lenses 17 exemplified in FIG. 2. As a result, in the region in the scanning direction (that is, the region I or region II) on the glass substrate 30 exemplified in FIG. 4, the thin film transistors 20 in the adjacent regions are irradiated with the laser beam 14 by the micro-lenses 17 in different columns. Therefore, in the region in the scanning direction (that is, the region I or the region II) on the glass substrate 30 exemplified in FIG. 4, the thin film transistors 20 in the adjacent regions have different characteristics from each other.

Further, as described above, since the radiated laser beam 14 is different between the regions (the region A or the region B exemplified in FIG. 3) orthogonal to the scanning direction, the thin film transistors 20 in the adjacent regions have different characteristics from each other.

As a result, in the entire glass substrate 30, the adjacent thin film transistors 20 have different characteristics from each other. Therefore, the difference in display (for example, the difference in light and shade of a color) due to the difference in the characteristics of the thin film transistor 20 is dispersed and does not appear linear. Accordingly, in the liquid crystal screen, the display unevenness does not become "stripes," and the display unevenness can be prevented from being emphasized.

In the first example, the glass substrate 30 moves a predetermined distance whenever the laser beam 14 is radiated by one micro-lens 17. The predetermined distance is a distance "H" between the plurality of thin film transistors 20 on the glass substrate 30, as exemplified in FIG. 2. The laser irradiation apparatus 10 stops the irradiation with the laser beam 14 when the glass substrate 30 moves the predetermined distance.

After the glass substrate 30 moves the predetermined distance "H," the laser irradiation apparatus 10 radiates the laser beam 14 using the micro-lenses 17 included in the micro-lens array 13. Since the projection mask pattern 15 shown in FIG. 6 is used in the first example, the laser beam 14 is radiated onto one amorphous silicon thin film 21 by the five micro-lenses 17.

Then, after the polysilicon thin film 22 is formed on the thin film transistor 20 of the glass substrate 30 using laser annealing, in another process, the source 23 and the drain 24 are formed in the thin film transistor 20.

As described above, in the first example, the characteristics of the adjacent thin film transistors 20 in the entire glass substrate 30 are different from each other, and the difference in the display (for example, the difference in light and shade of color) due to the difference in the characteristics does not appear "linear." Therefore, in the liquid crystal screen, the display unevenness does not become "stripes" and the display unevenness can be prevented from being emphasized.

SECOND EXAMPLE

A second example is an example in which the laser annealing is performed using one projection lens 18 instead of the micro-lens array 13.

Figure 7:
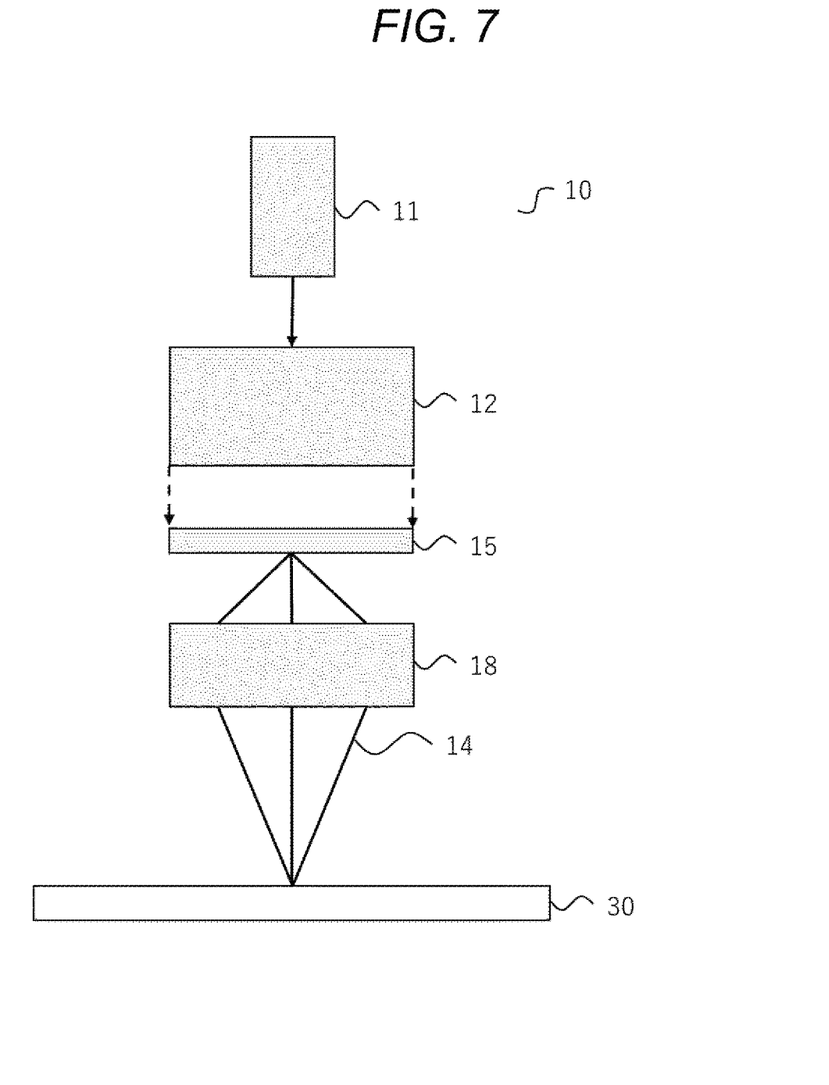
FIG. 7 is a view showing another configuration example of the laser irradiation apparatus 10.

FIG. 7 is a view showing a configuration of the laser irradiation apparatus 10 in the second example. As shown in FIG. 7, the laser irradiation apparatus 10 in the second example includes a laser beam source 11, a coupling optical system 12, a projection mask pattern 15, and a projection lens 18. Since the laser beam source 11 and the coupling optical system 12 have the same configuration as the laser beam source 11 and the coupling optical system 12 in the first example shown in FIGS. 1-5(B), detailed descriptions thereof will be omitted. Also, the projection mask pattern has the same configuration as the projection mask pattern in the first example, and thus the detailed description thereof will be omitted.

The laser beam passes through the opening (the transmission region) of the projection mask pattern 15 (not shown) and is radiated onto a predetermined region of the amorphous silicon thin film 21 by the projection lens 18. As a result, a predetermined region of the amorphous silicon thin film 21 is instantaneously heated and melted, and a part of the amorphous silicon thin film 21 becomes the polysilicon thin film 22.

Also, in the second example, the laser irradiation apparatus 10 radiates the laser beam 14 at a predetermined cycle, the glass substrate 30 is moved during the time when the laser beam 14 is not radiated, and the laser beam 14 is radiated on a next portion of the amorphous silicon thin film 21. Also, in the second example, as shown in FIG. 3, in the glass substrate 30, the amorphous silicon thin film 21 is disposed at a predetermined interval "H" in the moving direction. Then, the laser irradiation apparatus 10 irradiates the portion of the amorphous silicon thin film 21 disposed on the glass substrate 30 with the laser beam 14 at a predetermined cycle.

When the projection lens 18 is used, the laser beam 14 is converted by a magnification of an optical system of the projection lens 18. That is, a pattern of the projection mask pattern 15 is converted by the magnification of the optical system of the projection lens 18, and a predetermined region on the glass substrate 30 is laser-annealed.

That is, the mask pattern of the projection mask pattern 15 is converted by the magnification of the optical system of the projection lens 18, and a predetermined region on the glass substrate 30 is laser-annealed. For example, when the magnification of the optical system of the projection lens 18 is approximately 2×, the mask pattern of the projection mask pattern 15 is multiplied by about ½ (0.5), and a predetermined region on the glass substrate 30 is laser-annealed. The magnification of the optical system of the projection lens 18 is not limited to about 2× and may be any magnification. The mask pattern of the projection mask pattern 15 is laser-annealed at a predetermined region on the glass substrate 30 in accordance with the magnification of the optical system of the projection lens 18. For example, when the magnification of the optical system of the projection lens 18 is 4×, the mask pattern of the projection mask pattern 15 is multiplied by about ¼ (0.25), and laser annealing is performed on a predetermined region on the glass substrate 30.

Also, when the projection lens 18 forms an inverted image, a reduced image of the projection mask pattern 15 radiated on the glass substrate 30 is a pattern rotated 180 degrees around an optical axis of a lens in the projection lens 18. On the other hand, when the projection lens 18 forms a standing image, the reduced image of the projection mask pattern 15 radiated on the glass substrate 30 is the projection mask pattern 15 as it is.

As described above, in the second example, even when the laser annealing is performed using one projection lens 18, the characteristics of the adjacent thin film transistors 20 in the entire glass substrate 30 will be different from each other, and the difference in the display (for example, the difference in light and shade of color) due to the difference in the characteristics does not appear "linear." Therefore, in the liquid crystal screen, the display unevenness does not become the "stripes" and the display unevenness can be prevented from being emphasized.

In the above description, descriptions such as "vertical," "parallel," "planar," "orthogonal," and so on should not be interpreted strictly. That is, "vertical," "parallel," "planar" and "orthogonal" allow for tolerances or errors in design, manufacture, or the like and mean "substantially vertical," "substantially parallel," "substantially planar" and "substantially orthogonal." The tolerances and the errors are units within a range not departing from the desired configuration, operation and effect.

Furthermore, in the above description, descriptions such as "identical," "equal," "different," and so on in terms of dimension and size in appearance should not be interpreted strictly. That is, "identical," "equal," and "different" mean "substantially identical," "substantially equal," and "substantially different" as tolerances or errors in design, manufacture, or the like are allowed. The tolerances and the errors are units within a range not departing from the desired configuration, operation and effect.

Although our apparatus, transistors and methods have been described based on the drawings and examples, it should be noted that those skilled in the art can easily make various changes and modifications based on this disclosure. Therefore, it should be noted that these changes and modifications are included in the scope of this disclosure. For example, functions or the like included in each means, each process, or the like can be rearranged as long as it does not cause any logical contradiction, and it is possible to combine a plurality of means, processes, or the like into one or to further divide them. Further, the structures described in the above examples may be combined as appropriate.

What is claimed is:

1. A laser irradiation apparatus comprising:
    a light source that generates a laser beam;
    a projection lens that radiates the laser beam onto a predetermined region of an amorphous silicon thin film deposited between a source electrode and a drain electrode included in each of a plurality of thin film transistors on a glass substrate to form a polysilicon thin film; and
    a projection mask pattern provided on the projection lens and having a plurality of openings and that separates the laser beam into a plurality of laser beams so that at least one of the laser beams is radiated onto each of the plurality of thin film transistors,
    wherein the projection lens radiates the laser beams onto the plurality of thin film transistors on the glass substrate, which moves in a predetermined direction, through the projection mask pattern,
    the projection mask pattern is provided such that the plurality of openings are not continuous in one column orthogonal to the moving direction, and
    in the plurality of thin film transistors onto which the laser is beams are radiated, the laser beams different from each other are radiated through the projection mask pattern onto corresponding amorphous silicon thin films adjacent to each other of the thin film transistors adjacent to each other.

2. The laser irradiation apparatus according to claim 1, wherein the projection lens is a plurality of micro-lenses included in a micro-lens array capable of separating the laser beam, and the openings are provided in the projection mask pattern so that, among the micro-lenses in one column orthogonal to the moving direction, the micro-lenses radiating the laser beams through the openings are not adjacent to each other.

3. The laser irradiation apparatus according to claim 2, wherein the laser beam emitted from the light source is radiated onto the plurality of thin film transistors through the micro-lenses corresponding to the one column in the orthogonal direction in one irradiation, and the openings are provided in the projection mask pattern so that the laser beams are radiated through the micro-lenses not adjacent to each other among the micro-lenses corresponding to the one column.

4. The laser irradiation apparatus according to claim 1, wherein the projection lens irradiates each of the plurality of thin film transistors with a predetermined number of laser beams and, in the projection mask pattern, a predetermined number of openings are provided in the moving direction.

5. The laser irradiation apparatus according to claim 2, wherein the projection lens irradiates each of the plurality of thin film transistors with a predetermined number of laser beams and, in the projection mask pattern, a predetermined number of openings are provided in the moving direction.

6. The laser irradiation apparatus according to claim 3, wherein the projection lens irradiates each of the plurality of thin film transistors with a predetermined number of laser beams and, in the projection mask pattern, a predetermined number of openings are provided in the moving direction.

7. The laser irradiation apparatus according to claim 2, wherein the projection lens radiates the laser beams onto a predetermined region of the amorphous silicon thin film deposited between a source electrode and a drain electrode included in the thin film transistor, and a polysilicon thin film is formed.

8. The laser irradiation apparatus according to claim 3, wherein the projection lens radiates the laser beams onto a predetermined region of the amorphous silicon thin film deposited between a source electrode and a drain electrode included in the thin film transistor, and a polysilicon thin film is formed.

9. The laser irradiation apparatus according to claim 4, wherein the projection lens radiates the laser beams onto a predetermined region of the amorphous silicon thin film deposited between a source electrode and a drain electrode included in the thin film transistor, and a polysilicon thin film is formed.

10. A method of manufacturing a thin film transistor, comprising:
- a first step of generating a laser beam;
- a second step of separating the laser beam into a plurality of laser beams and radiating at least one of the laser beams onto a predetermined region of an amorphous silicon thin film deposited between a source electrode and a drain electrode included in each of a plurality of thin film transistors on a glass substrate using a projection lens having a projection mask pattern including a plurality of openings; and
- a third step of moving the glass substrate in a predetermined direction whenever the laser beams are radiated,
- wherein, in the second step, the laser beams different from each other are radiated through the projection mask pattern disposed so that the plurality of openings are not continuous in one column orthogonal to the moving direction onto corresponding amorphous silicon thin films adjacent to each other of the thin film transistors adjacent to each other in the plurality of thin film transistors.

11. The method according to claim 10, wherein the projection lens is a plurality of micro-lenses included in a micro-lens array capable of separating the laser beam and, in the second step, the laser beams are radiated through the projection mask pattern in which the openings are provided so that, among the micro-lenses in the one column orthogonal to the moving direction, the micro-lenses radiating the laser beams through the openings are not adjacent to each other.

12. The method according to claim 11, wherein the openings are provided in the projection mask pattern so that the laser beams are radiated through the micro-lenses not adjacent to each other among the micro-lenses corresponding to the one column and, in the second step, the laser is beams are radiated onto the plurality of thin film transistors through the micro-lenses corresponding to the one column in the orthogonal direction in one irradiation.

13. The method according to claim 10, wherein, in the second step, a predetermined number of laser beams are radiated onto each of the plurality of thin film transistors through the projection mask pattern in which a predetermined number of openings are provided in the moving direction.

14. The method according to claim 11, wherein, in the second step, a predetermined number of laser beams are radiated onto each of the plurality of thin film transistors through the projection mask pattern in which a predetermined number of openings are provided in the moving direction.

15. The method according to claim 12, wherein, in the second step, a predetermined number of laser beams are radiated onto each of the plurality of thin film transistors through the projection mask pattern in which a predetermined number of openings are provided in the moving direction.

16. The method according to claim 11, wherein, in the second step, the laser beams are radiated onto a predetermined region of the amorphous silicon thin film deposited between a source electrode and a drain electrode included in the thin film transistor, and a polysilicon thin film is formed.

17. The method according to claim 12, wherein, in the second step, the laser beams are radiated onto a predetermined region of the amorphous silicon thin film deposited between a source electrode and a drain electrode included in the thin film transistor, and a polysilicon thin film is formed.

18. The method according to claim 13, wherein, in the second step, the laser beams are radiated onto a predetermined region of the amorphous silicon thin film deposited between a source electrode and a drain electrode included in the thin film transistor, and a polysilicon thin film is formed.

* * * * *